(12) United States Patent
Asaoka (10) Patent No.: US 6,368,415 B1
(45) Date of Patent: Apr. 9, 2002

(54) METHOD FOR WASHING SEMICONDUCTOR SUBSTRATE AND WASHING APPARATUS THEREFOR

(75) Inventor: Yasuhiro Asaoka, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/116,888

(22) Filed: Jul. 16, 1998

(30) Foreign Application Priority Data

Jan. 19, 1998 (JP) ............................................ 10-007750

(51) Int. Cl.$^7$ ............................... B08B 3/08; C23G 1/02
(52) U.S. Cl. ................................. 134/3; 134/26; 134/28
(58) Field of Search ................................. 134/3, 26, 28

(56) References Cited

U.S. PATENT DOCUMENTS

| | | | | | |
|---|---|---|---|---|---|
| 3,869,313 | A | * | 3/1975 | Jones et al. ..................... 134/73 |
| 4,264,374 | A | * | 4/1981 | Beyer et al. ..................... 134/3 |
| 4,577,650 | A | * | 3/1986 | McConnell .................... 134/59 |
| 4,695,327 | A | * | 9/1987 | Grebinski ..................... 134/11 |
| 4,778,532 | A | * | 10/1988 | McConnell et al. ........... 134/10 |
| 4,795,497 | A | * | 1/1989 | McConnell et al. .......... 134/18 |
| 4,997,490 | A | * | 3/1991 | Vetter et al. .................. 134/26 |
| 5,030,319 | A | * | 7/1991 | Nishino et al. ............... 216/87 |
| 5,129,955 | A | * | 7/1992 | Tanaka .......................... 134/2 |
| 5,232,511 | A | * | 8/1993 | Bergman ........................ 134/2 |
| 5,238,500 | A | * | 8/1993 | Bergman ........................ 134/3 |
| 5,470,393 | A | * | 11/1995 | Fukazawa ...................... 134/3 |
| 5,489,557 | A | * | 2/1996 | Jolley ....................... 156/640.1 |
| 5,647,953 | A | * | 7/1997 | Williams et al. ............. 134/1.1 |
| 5,810,940 | A | * | 9/1998 | Fukazawa et al. ............. 134/3 |

FOREIGN PATENT DOCUMENTS

| | | | | |
|---|---|---|---|---|
| JP | 03-222328 | * | 11/1991 | ..................... 134/3 |
| JP | 5-166776 | | 7/1993 | |
| JP | 5-343380 | | 12/1993 | |
| JP | 7-230975 | | 8/1995 | |
| JP | 7-263392 | | 10/1995 | |
| JP | 8-316187 | | 11/1996 | |

* cited by examiner

*Primary Examiner*—Randy Gulakowski
*Assistant Examiner*—Saeed Chaudhry
(74) *Attorney, Agent, or Firm*—McDermott, Will & Emery (57) ABSTRACT

A method for washing a semiconductor substrate having an oxide formed on its surface, which comprises a step for immersing the semiconductor substrate in a first treatment bath to which hydrofluoric acid and pure water are supplied; a step for transporting the semiconductor substrate from the first treatment bath to a second treatment bath to which an inorganic acid and pure water are supplied to adjust the pH value to not more than 7, and immersing the semiconductor substrate in the second treatment bath; and a step for supplying only pure water to the second treatment bath and washing the semiconductor substrate.

3 Claims, 6 Drawing Sheets

METHOD FOR WASHING SEMICONDUCTOR SUBSTRATE AND WASHING APPARATUS THEREFOR

BACKGROUND OF THE INVENTION

1. Field of the Invention

The present invention relates to a method for washing a semiconductor substrate having a silicon oxide film formed thereon, and a washing apparatus therefor.

2. Discussion of Background

Semiconductor devices are formed through many production steps. Between the respective steps, if necessary, removal of dust particles or contaminants adhered to the surface of a semiconductor substrate is carried out, or during the etching, a treatment using acid type or alkali type chemicals is carried out. Subsequently, washing is carried out with pure water containing no chemicals. The washing is carried out for the removal of chemicals, since if chemicals remain on the surface of the semiconductor substrate, adverse affects are given to the properties of semiconductor devices.

For example, if hydrochloric acid remains on the surface of a semiconductor substrate, when a metallic wiring of aluminum or copper is formed thereon, there are problems that chlorine of the hydrochloric acid reacts with the metal to cause corrosion and breakage of the wiring. Accordingly, after the treatment with chemicals, it is required to finally conduct washing with pure water containing no chemicals.

However, by the washing with pure water for the removal of the chemicals, silicon oxides are formed on hydrophobic portions of the surface of the semiconductor substrate. Further, it has been known that during the progressing from a certain step to the next step, an oxide film is naturally formed by exposing the semiconductor substrate to air. Along the progress toward the fine structure of semiconductor devices, such a silicon oxide (film) largely influences the film properties of its upper and lower adjoining films, by which electrical properties and reliability of semiconductor devices are reduced To remove such a silicon oxide film, it has been attempted to immerse the semiconductor substrate in pure water containing hydrofluoric acid or pure water containing ammonium fluoride and hydrofluoric acid, and then wash it with pure water containing no chemicals. By the washing with the pure water containing no chemicals, fluorine atoms bonded to the silicon atoms of the surface of the semiconductor substrate are replaced by hydrogen atoms. Such a washing is essential since a film further formed thereon tends to be irregular without it.

Figure 8:
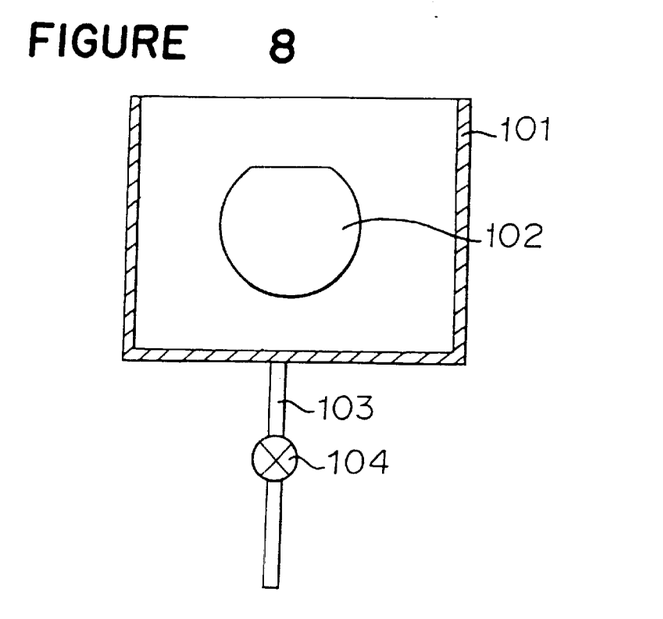
FIG. 8 is a view showing a conventional washing apparatus for washing a semiconductor substrate.
Figure 9:
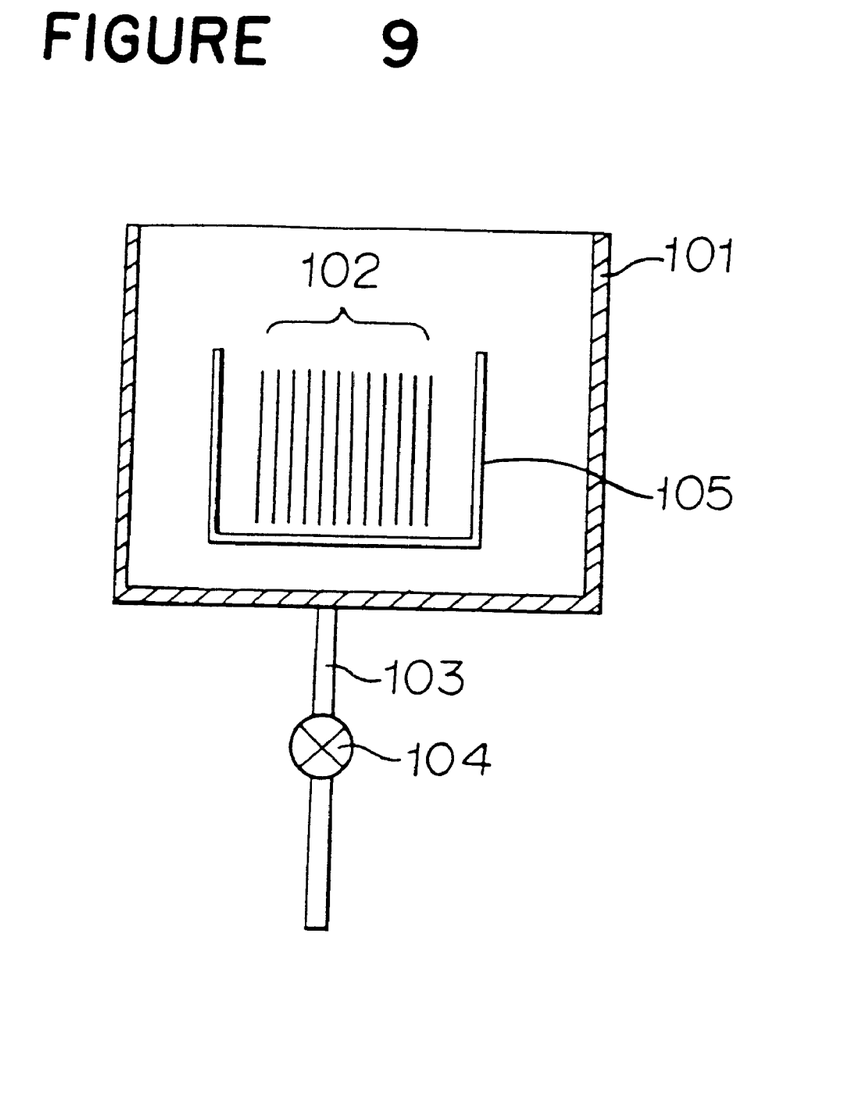
FIG. 9 is a view showing a conventional washing apparatus for washing a semiconductor substrate.

FIGS. 8 and 9 show conventional washing apparatuses of semiconductor substrates. In the Figures, 101 is a treatment bath, 102 is a semiconductor substrate, 103 is a supply line, 104 is a supply valve and 105 is a cassette. To remove a silicon oxide (film) formed on the surface of a semiconductor substrate, pure water containing hydrofluoric acid or pure water containing hydrofluoric acid and ammonium fluoride, and pure water containing no chemicals, are used, for each of which an exclusive washing apparatus is provided.

For example, when an silicon oxide (film) is removed with pure water containing hydrofluoric acid, firstly, a treatment bath 101 is filled with pure water containing hydrofluoric acid by means of a supply line 103 as shown in FIG. 8, and then a semiconductor substrate 102 having a silicon oxide (film) formed on its surface is immersed to remove the silicon oxide (film).

Then, into a treatment bath 101 of another washing apparatus, pure water containing no chemicals is supplied by means of a supply line 103, and then a semiconductor substrate 102 is immersed in the treatment bath 101 to remove the hydrofluoric acid.

In such washing apparatuses, both the pure water containing hydrofluoric acid and the pure water containing no chemicals are supplied by means of each supply line 103. The pure water containing hydrofluoric acid is circulated and used several times, whereas the pure water containing no chemicals is overflowed from the treatment bath 101.

The semiconductor substrate 102 may be put in the treatment bath 101 singly or in groups of plural pieces. Further, when plural pieces are treated all at once, the semiconductor substrates 102 may be put in a cassette 105 as shown in FIG. 9.

However, after the removal of the silicon oxide (film), when washing is conducted with pure water containing no chemicals to remove the hydrofluoric acid or ammonium fluoride adhered to the surface of the semiconductor substrate, there are problems such that a silicon oxide (film) is formed again by the below-mentioned reactions.

Firstly, by the treatment of the silicon oxide (film) adhered to the surface of the semiconductor substrate with hydrofluoric acid, $SiF_6^{2-}$ ions are formed on and in the vicinity of the surface of the semiconductor substrate. The $SiF_6^{2-}$ ions are formed during the etching of the silicon oxide film with substances containing fluorine.

Then, pure water containing no chemicals is supplied to initiate a washing treatment, whereupon the pH value is rapidly raised and a hydrolysis reaction of the $SiF_6^{2-}$ ions is caused as shown in the following formula (1).

$$SiF_6^{2-} + 6H_2O \leftrightarrows Si(OH)_6^{2-} + 6HF \qquad (1)$$

The $Si(OH)_6^{2-}$ ions formed by this reaction undergo a dehydration condensation reaction to one another, whereby colloidal silica consisting of $SiO_2$ is formed in the solution and adhere to the surface of the semiconductor substrate. The colloidal silica is a silicon oxide in a colloid state, and causes a problem such that the colloidal silica adheres to the surface of the semiconductor substrate made of silicon and becomes a silicon oxide (film), thereby deteriorating the properties of semiconductor devices.

Further, especially when a semiconductor device is formed by using a semiconductor substrate having a silicon oxide film of about 3,000 Å formed on its back, by treating plural pieces of semiconductor substrates put in a cassette 105 all at once as shown in FIG. 9, there are problems such that more colloidal silica may be generated from the back of the semiconductor substrate 102 than its surface, and resultingly more silicon oxide (film) will be formed on the surface of the adjoining semiconductor substrate.

SUMMARY OF THE INVENTION

Under such circumstances, the present invention have been made. It is an object of the present invention to provide a method for washing a semiconductor substrate wherein after the removal of a silicon oxide (film) formed on the surface of the semiconductor substrate, no silicon oxide (film) is formed again even if washed with pure water containing no chemicals, by which the properties of semiconductor devices can be improved, and a washing apparatus therefor.

The present invention provides a method for washing a semiconductor substrate having an oxide formed on its surface, which comprises a step for immersing the semiconductor substrate in a first treatment bath to which hydrofluoric acid and pure water are supplied; a step for transporting the semiconductor substrate from the first treatment bath to a second treatment bath to which an inorganic acid and pure water are supplied to adjust the pH value to not more than 7 and immersing the semiconductor substrate in th e second treatment bath; and a step for supplying only pure water to the second treatment bath and washing the semiconductor substrate.

Preferably, after supplying the inorganic acid and the pure water to the second treatment bath, the concentration of the inorganic acid supplied to the second treatment bath is reduced stepwise so that only water is supplied.

Further, the inorganic acid is preferably hydrochloric acid.

The present invention also provides a washing apparatus for washing a semiconductor substrate which has an oxide formed on its surface and is treated with hydrofluoric acid, which comprises a treatment bath to which an inorganic acid and pure water are supplied for washing the semiconductor substrate; a first supply line for supplying the pure water which has a supply valve and is connected to the bottom of the treatment bath; and a second supply line for supplying the inorganic acid which has a supply amount-controlling means and is connected to the first supply line.

The present invention further provides a washing apparatus for washing a semiconductor substrate having an oxide formed on its surface, which comprises a treatment bath to which hydrofluoric acid, an inorganic acid and pure water are supplied for washing the semiconductor substrate; a first supply line for supplying the pure water which has a supply valve and is connected to the bottom of the treatment bath; a second supply line for supplying the inorganic acid which has a first supply amount-controlling means and is connected to the first supply line; and a third supply line for supplying the hydrofluoric acid which has a second supply amount-controlling means and is connected to the first supply line.

Further, the supply amount-controlling means is preferably a valve.

DETAILED DESCRIPTION OF THE PREFERRED EMBODIMENTS

Now, the present invention will be described in detail with reference to the preferred embodiments.

Mode 1 for Carrying Out the Present Invention

Figure 1:
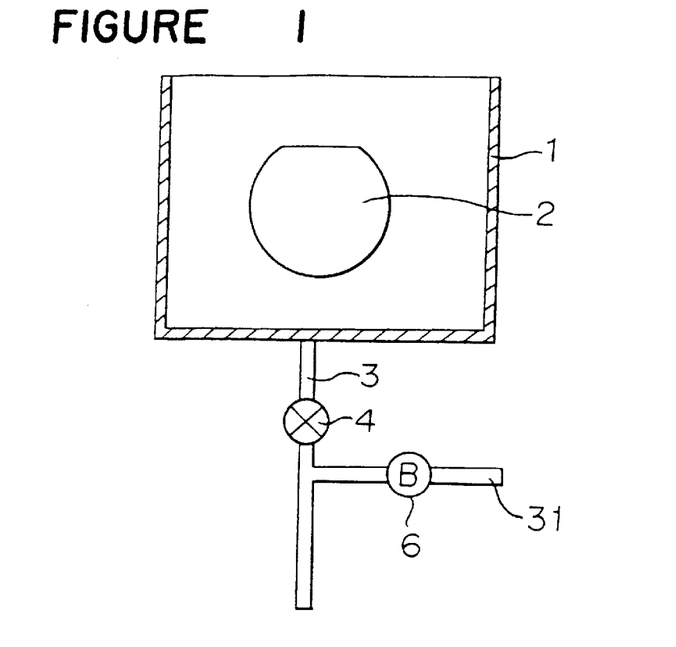
FIG. 1 is a cross-sectional view of a washing apparatus for washing a semiconductor substrate, which shows the mode 1 for carrying out the present invention.
Figure 2:
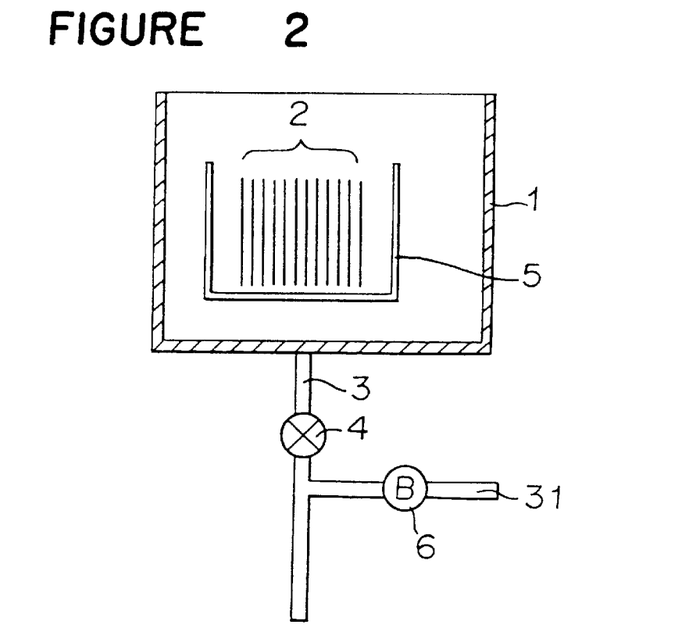
FIG. 2 is a cross-sectional view of a washing apparatus for washing a semiconductor substrate, which shows the mode 1 for carrying out the present invention.
Figure 3:
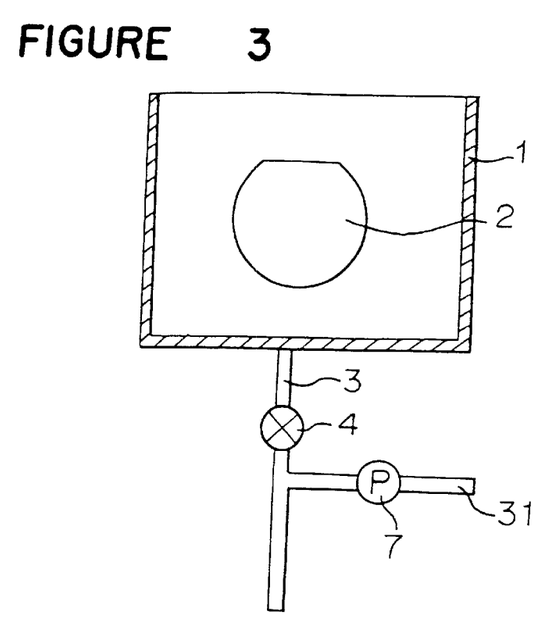
FIG. 3 is a cross-sectional view of a washing apparatus for washing a semiconductor substrate, which shows the mode 1 for carrying out the present invention.

FIGS. 1 to 3 are cross-sectional views showing the washing apparatus for washing a semiconductor substrate, which shows the mode 1 for carrying out the present invention. In FIGS. 1 to 3, 1 is a treatment bath, 2 is a semiconductor substrate, 3 and 31 are supply lines, 4 is a supply valve, 5 is a cassette, 6 is a valve and 7 is a pump.

The washing apparatus shown in FIG. 1 is an apparatus used after removing silicon oxide (film) attached to the surface of the semiconductor substrate 2 with hydrofluoric acid. In this apparatus, the semiconductor substrate 2 is immersed in the treatment bath 1 to wash such chemicals off. The supply line 3 is connected to the treatment bath 1, and pure water is supplied by opening or shutting the supply valve 4. Further, a supply line 31 is connected to the supply line 3, and an inorganic acid such as hydrochloric acid is thereby supplied. The added amount of the inorganic acid can be controlled by adjusting the degree of opening of the valve 6 disposed on the supply line 31. Further, the position at which the supply line 31 is connected to the supply line 3, may be closer to or away from the treatment bath 1 than the supply valve 4.

The treatment bath 1 may be not only the one wherein each piece of the semiconductor substrate 2 is put therein or plural pieces thereof are put therein at once for treatment as shown in FIG. 1, but also the one wherein plural pieces of the semiconductor substrates 2 are put in the cassette 5 for treatment as shown in FIG. 2.

Further, as shown in FIG. 3, as the supply amount-controlling means of the inorganic acid, the pump 7 which is capable of supplying the inorganic acid in a constant amount with one shot may be disposed instead of the valve 6, by which the amount of the inorganic acid may be adjusted by the change of the number of the shot.

By using the apparatus for washing a semiconductor substrate, it is possible not only to adjust the amount of the inorganic acid such as hydrochloric acid in the pure water but also to change the amount during the washing treatment, by which the washing can be conducted with good controllability. Accordingly, the quality of the film subsequently formed becomes excellent, and semiconductor devices having improved reliability and properties can be obtained.

Figure 4:
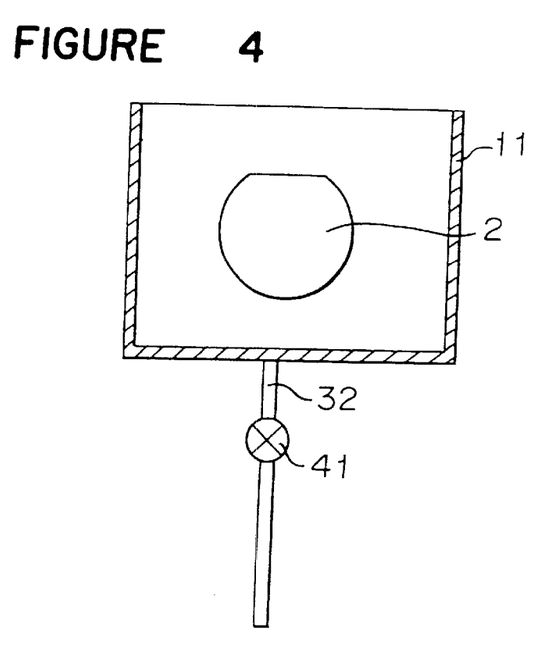
FIG. 4 is a view showing a step of a method for washing a semiconductor substrate, which shows the mode 1 for carrying out the present invention.
Figure 5:
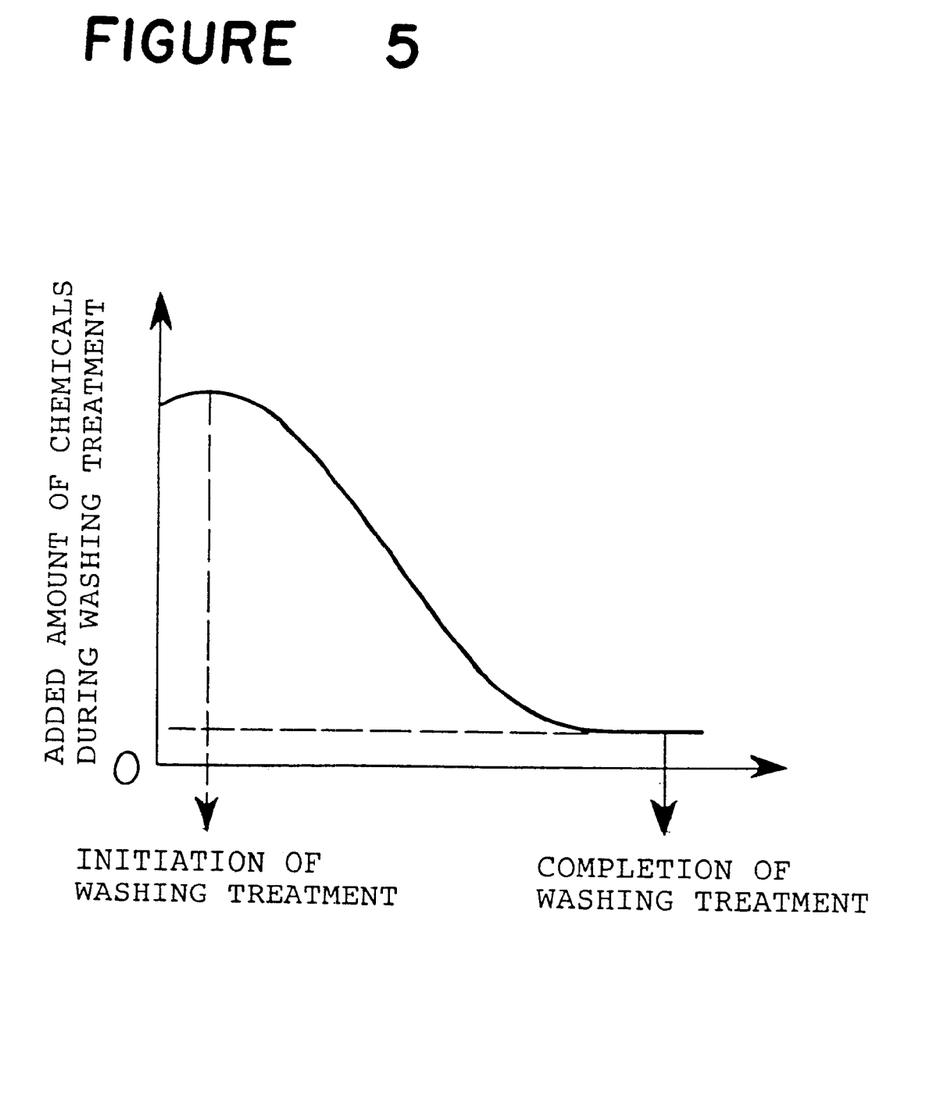
FIG. 5 is a graph showing the relationship between the elapsed time of washing treatment and the added amount of an inorganic acid, according to the mode 1 for carrying out the present invention.
Figure 6:
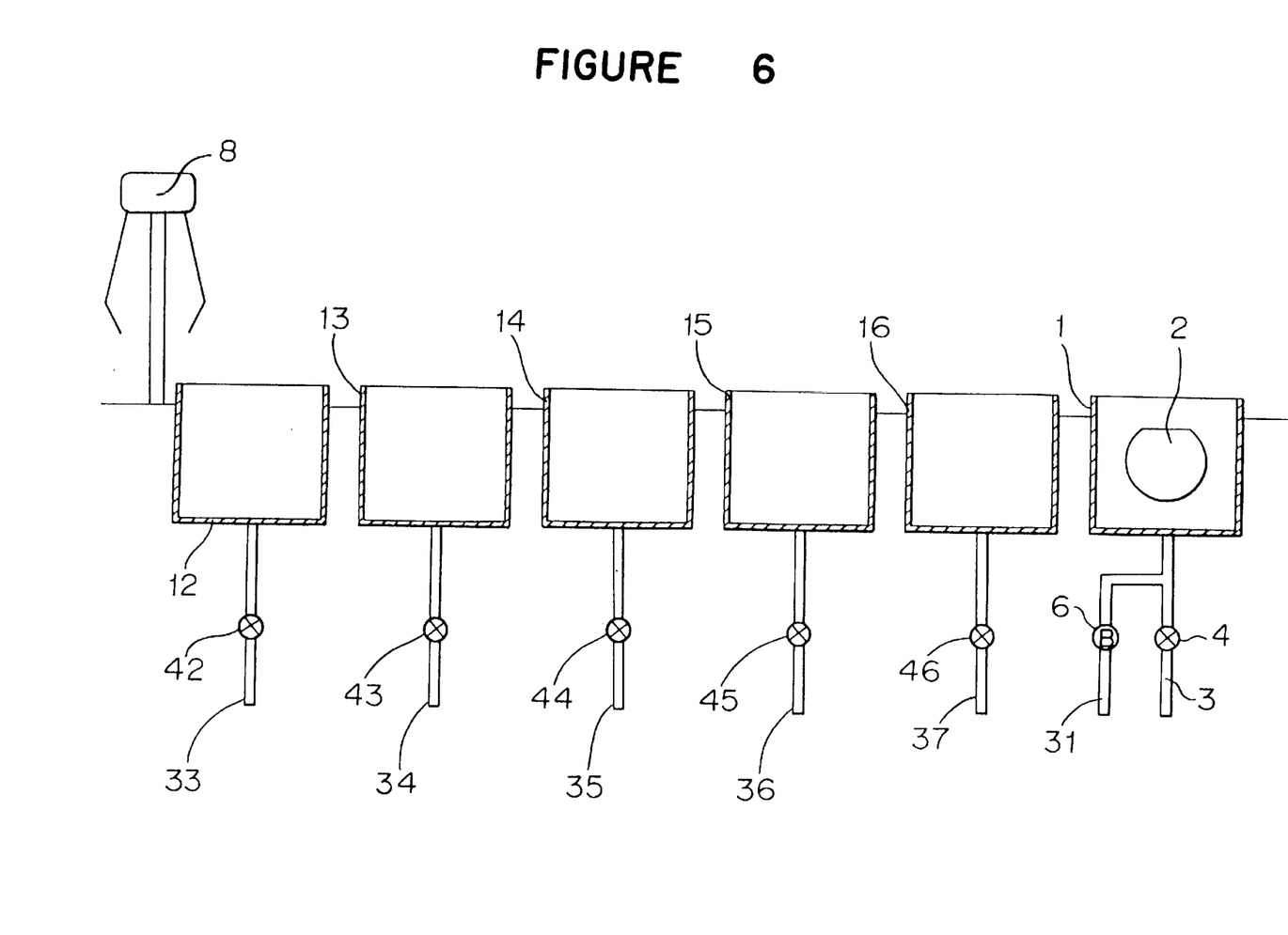
FIG. 6 is a view showing a step of another method for washing a semiconductor substrate, which shows the mode 1 for carrying out the present invention.

FIG. 4 shows a process of the method for washing a semiconductor substrate according to the mode 1 for carrying out the present invention. In this Figure, 11 is a treatment bath, 32 is a supply line and 41 is a supply valve. FIG. 5 is a graph showing the relation between the elapsed time of the washing treatment with the inorganic acid and the added amount of the inorganic acid. Further, FIG. 6 shows a step of another method for washing a semiconductor substrate according to the mode 1 for carrying out the present invention, and the inside of a multi-bath system washing apparatus. In this Figure, 8 is an arm, 12 to 16 are treatment baths, 33 to 37 are supply lines and 42 to 46 are supply valves.

Washing apparatuses as shown in FIG. 4 are separately prepared, and an acid type chemical solution, an alkali type chemical solution or pure water containing no chemicals is supplied to the treatment bath 11. Further, the washing apparatuses to which pure water containing no chemicals is supplied, are classified into the one for washing the acid type chemical solution off and the one for washing the alkali type chemical solution off.

Firstly, to the treatment bath 11 of the washing apparatus as shown in FIG. 4, an acid type chemical solution or an alkali type chemical solution is supplied, and the semiconductor substrate 2 is immersed to remove dust particles or contaminants adhered to the surface of the semiconductor substrate 2 or conduct etching. When treatment is conducted with the acid type chemical solution, the treatment bath 11 of an exclusive washing apparatus is filled with, for example, sulfuric acid, hydrogen peroxide and pure water, and when treatment is conducted with the alkali type chemical solution, the treatment bath 11 of an exclusive washing apparatus is filled with, for example, aqueous ammonia, hydrogen peroxide and pure water, and each treating bath is adjusted to a concentration suitable for each treatment. Then, the semiconductor substrate is washed by either a washing apparatus having a treatment bath 11 filled with pure water for washing the acid type chemical solution off, or a washing apparatus having a treatment bath 11 filled with pure water for washing the alkali type chemical solution off.

The semiconductor substrate 2 having a silicon oxide (film) formed on its surface by the above treatment, is immersed in pure water containing hydrofluoric acid. The washing apparatus used here has a structure as shown in FIG. 4, wherein the treatment bath 11 is filled with pure water containing hydrofluoric acid at a constant concentration or pure water containing ammonium fluoride and hydrofluoric acid at a constant concentration.

Then, the semiconductor substrate 2 is immersed in the treatment bath 1 filled with pure water containing hydrochloric acid as shown in FIG. 1, and subsequently the valve 6 is shut to supply only pure water. By this operation, the pure water is overflowed and resultingly the washing bath 1 is filled with pure water containing no chemicals to wash the surface of the semiconductor substrate 2.

For example, when a silicon oxide (film) of about 300 Å is formed on the surface of the semiconductor substrate, the semiconductor substrate is firstly immersed in pure water containing about 0.5 wt % of hydrofluoric acid in the washing apparatus as shown in FIG. 4 for 15 minutes. The pure water containing hydrofluoric acid may be overflowed, and circulated and used several times. Further, when the concentration of the hydrofluoric acid is low, unused liquid is supplied and used liquid may be overflowed and discharged.

Then, the semiconductor substrate 2 is transported to the treatment bath 1 of the washing apparatus as shown in FIG. 1. At this time, the pure water in the treatment bath 1 contains about 0.1 wt % of hydrochloric acid and the pH value thereof is about 1.5. However, the pH value is not limited thereto so long as it is not more than 7. Further, the supply valve 4 is opened to supply the pure water, and at the same time, the valve 6 is adjusted to supply hydrochloric acid so that the hydrochloric acid concentration in the treatment bath 1 is maintained at the level of about 0.1 wt %, and washing is conducted for 3 minutes while overflowing the liquid, whereupon the valve 6 is shut and the supply of only the pure water containing no chemicals is continued for 12 minutes. Then, drying is conducted.

Further, as shown in FIG. 5, the added amount of the inorganic acid such as hydrochloric acid is gradually reduced as the washing treatment proceeds, and the washing is finally conducted only with the pure water, the change of the concentration of hydrochloric acid in the treatment bath 1 becomes further gradual, such being effective for suppressing the formation of colloidal silica.

For example, when a silicon oxide (film) of about 300 Å is formed on the surface of the semiconductor substrate 2, the semiconductor substrate is immersed for 15 minutes in pure water containing about 0.5 wt % of hydrofluoric acid in the washing apparatus as shown in FIG. 4. The pure water containing hydrofluoric acid may be overflowed, and circulated and used several times. Further, when the concentration of the hydrofluoric acid is low, unused liquid is supplied and used liquid may be overflowed and discharged.

Then, the semiconductor substrate 2 is transported to the treatment bath 1 of the washing apparatus as shown in FIG. 1. At this time, the pure water in the treatment bath 1 contains about 0.1 wt % of hydrochloric acid, and the pH value thereof is about 1.5. However, the pH value is not limited thereto so long as it is not more than 7. Further, the supply valve 4 is opened to supply pure water, and at the same time, the valve 6 is controlled so that the hydrochloric acid concentration in the treatment bath 1 is reduced by 0.02 wt % with the lapse of 1 minute from the initiation of the washing treatment, and with the lapse of 5 minutes after the initiation of the washing treatment, only pure water is supplied. In this condition, washing is continued for 10 minutes. Then, drying is conducted.

When plural pieces of the semiconductor substrates 2 are put in the treatment bath 1, the treatment is conducted in the same manner as in the case where plural pieces are put in the cassette 5 as shown in FIG. 2.

Further, to remove the silicon oxide (film), ammonium fluoride may further be added to the pure water containing hydrofluoric acid. Pure water containing an inorganic acid such as nitric acid, sulfuric acid, phosphoric acid or hydrofluoric acid instead of the hydrochloric acid, may be supplied. However, hydrochloric acid is preferred since it is unlikely to adhere to the semiconductor substrate due to its low viscosity and to form an oxide.

Further, as shown in FIG. 3, as a means for controlling the supply amount of the inorganic acid, a pump 7 which is capable of supplying the inorganic acid in a constant amount with one shot may be disposed instead of the valve 6 as shown in FIGS. 1 and 2, and the amount of the inorganic acid may be adjusted by the change of the number of shot.

Further, as shown in FIG. 6, the present invention may be applied to a multi-bath type washing apparatus wherein a treatment bath 12 exclusively used for the treatment with pure water containing an acid type chemical solution, a treatment bath 13 filled with pure water for washing the acid type chemical solution off, a treatment bath 14 exclusively used for the treatment with pure water containing an alkali type chemical solution, a treatment bath 15 filled with pure water for washing the alkali type chemical solution off, a treatment bath 16 filled with pure water containing hydrofluoric acid or pure water containing ammonium fluoride and hydrofluoric acid, and a treatment bath 1 filled with pure water containing an inorganic acid such as hydrochloric acid, are integrated.

At this time, to the treatment baths 12, 14 and 16, pure water containing chemicals for each bath is supplied by opening and shutting each of the supply valves 42, 44 and 46, and the overflowed pure water containing chemicals for each bath is circulated and used several times. On the other hand, the pure water supplied to each of the treatment baths 13 and 15, is overflowed and discharged, namely not used again. Further, the pure water containing the inorganic acid filled into the treatment bath 1 is overflowed and discharged, and replaced with the pure water containing no inorganic acid.

In the multi-bath type washing apparatus, the semiconductor substrate and cassette may be transported automatically with a robot arm 8, as the case requires.

As described above, according to the method for washing the semiconductor substrate, when the chemicals such as hydrofluoric acid or ammonium fluoride on the surface of the semiconductor substrate are washed off, the pure water containing an inorganic acid is overflowed while thereby suppressing the rapid reduction of the pH value, whereby the $SiF_6^{2-}$ ions formed on the surface of the semiconductor substrate are eliminated from the treatment bath 1 in an ionic state, and then the washing is conducted with pure water containing no chemicals. By such a treatment, the progress of a hydrolysis reaction of the $SiF_6^{2-}$ ions is prevented and the formation of colloidal silica is thereby prevented, whereby not only the silicon oxide (film) is removed but also no chemicals remain on the surface of the semiconductor substrate, and resultingly semiconductor devices having improved reliability and semiconductor properties can be obtained.

Mode 2 for Carrying Out the Present Invention

Figure 7:
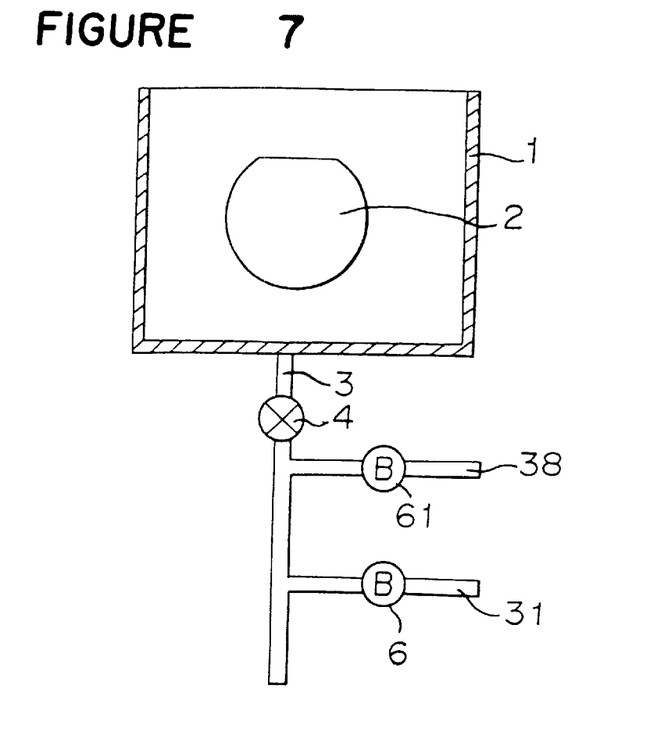
FIG. 7 is a cross-sectional view of a washing apparatus for washing a semiconductor substrate, according to the mode 2 for carrying out the present invention.

FIG. 7 is a cross-sectional view showing the apparatus for washing the semiconductor substrate according to the mode 2 for carrying out the present invention. In this Figure, 38 is a supply line and 61 is a valve.

The washing apparatus shown in FIG. 7 is an apparatus for removing the silicon oxide (film) adhered to the surface of the semiconductor substrate 2. Both a treatment with pure water containing hydrofluoric acid and a washing with pure water containing an inorganic acid such as hydrochloric acid may be conducted within a treatment bath 1.

To a supply line 3, a supply line 31 and a supply line 38 are connected. From the supply line 38, hydrofluoric acid is supplied and the supply amount is controlled by a valve 61. From the supply line 31, an inorganic acid such as hydrochloric acid is supplied and the supply amount is controlled by a valve 6. The positions of the supply line 31 and the supply line 38 may be inverted. Further, pumps may be disposed instead of the valve 6 and valve 61 (not shown).

The method for washing the semiconductor substrate according to the mode 2 for carrying out the present invention will be described with reference to FIG. 7.

Firstly, in the same manner as in the mode 1 for carrying out the present invention, a treatment of the semiconductor substrate is conducted with an acid type chemical solution or an alkali type chemical solution and pure water.

Then, the semiconductor substrate 2 is transported into the treatment bath 1 of the washing apparatus shown in FIG. 7. At this time, the treatment bath 1 is filled with pure water containing about 0.5 wt % of hydrofluoric acid by opening the supply valve 4 and adjusting the valve 61, and the supply of the hydrofluoric acid and pure water is already terminated. Further, the valve 6 is shut and no inorganic acid such as hydrochloric acid is supplied. The semiconductor substrate 2 is immersed in the treatment bath 1 for 15 minutes, whereupon the supply valve 4 is opened and at the same time, the valve 6 is adjusted to supply the pure water containing about 0.1 wt % of hydrochloric acid is supplied for 3 minutes while overflowing the bath. Then, the valve 6 is shut and the supply of pure water containing no chemicals is continued for 12 minutes. Subsequently, drying is conducted.

According to the apparatus for washing the semiconductor substrate, both the washing with pure water containing hydrofluoric acid and the washing with pure water containing an inorganic acid such as hydrochloric acid can be conducted within a common treatment bath 1, and the steps can be simplified i.e. the transportation of the semiconductor substrate 2 can be eliminated.

The present invention constituted as described above shows the following effects.

In the present invention, when the chemicals such as hydrofluoric acid and ammonium fluoride on the surface of the semiconductor substrate are washed off, pure water containing an inorganic acid is overflowed while thereby suppressing the rapid reduction of the pH value, and the $SiF_6^{2-}$ ions generated on the surface of the semiconductor substrate are removed from the treatment bath in the ionic state, and then washing with pure water containing no chemicals is conducted. By such a treatment, the progress of a hydrolysis reaction of the $SiF_6^{2-}$ ions can be prevented and the formation of colloidal silica can thereby be prevented, whereby not only the silicon oxide (film) is removed but also no chemicals remain on the surface of the semiconductor substrate, and resultingly semiconductor devices having improved reliability and semiconductor properties can be obtained.

Further, the concentration of the inorganic acid contained in the pure water to be supplied is reduced stepwise, whereby the concentration of the inorganic acid in the treatment bath is changed gradually, the formation of colloidal silica is effectively suppressed and the reliability and properties of the semiconductor device can be improved.

Moreover, since hydrochloric acid is preferably used as the inorganic acid, the pure water containing hydrochloric acid is unlikely to adhere to the semiconductor substrate due to its low viscosity and to form an oxide, whereby the washing of the semiconductor substrate is effectively conducted and the reliability and properties of the semiconductor devices can further be improved.

Furthermore, not only the amount of the inorganic acid such as hydrochloric acid contained in the pure water may be adjusted, but also the supply amount may be changed during the washing treatment, whereby the washing can be conducted with a high controllability and the quality of the film subsequently formed thereon is made excellent, and resultingly semiconductor devices having improved reliability and properties can be obtained.

Moreover, the washing with pure water containing hydrofluoric acid and the washing with pure water containing an inorganic acid such as hydrochloric acid can be conducted in a common treatment bath, whereby the steps can be simplified i.e. the transportation of the semiconductor substrate can be eliminated.

Further, the supply amounts of the inorganic acid and hydrofluoric acid may preferably be controlled by a valve, whereby fine adjustment can be made, effective washing can be made and the amount of the discharged chemicals can be reduced.

What is claimed is:

1. A method for washing semiconductor substrate having an oxide formed on its surface, which consists essentially of: a step for immersing the semiconductor substrate in a first treatment bath to which hydrofluoric acid and pure water are supplied; a step for transporting the semiconductor substrate from the first treatment bath to a second treatment bath to which an inorganic acid and pure water are supplied to adjust the pH value to not more than 7, and immersing the semiconductor substrate in the second treatment bath; and a step for supplying only pure water to the second treatment bath and washing the semiconductor substrate.

2. The method for washing a semiconductor substrate according to claim 1, wherein after supplying the inorganic acid and the pure water to the second treatment bath, the concentration of the inorganic acid supplied to the second treatment bath is reduced stepwise so that only pure water is supplied.

3. The method for washing a semiconductor substrate according to claim 1, wherein the inorganic acid is hydrochloric acid.

* * * * *